United States Patent
Zhu et al.

(10) Patent No.: US 11,823,892 B2
(45) Date of Patent: *Nov. 21, 2023

(54) GAS MIXTURE INCLUDING HYDROGEN FLUORIDE, ALCOHOL AND AN ADDITIVE FOR PREVENTING STICTION OF AND/OR REPAIRING HIGH ASPECT RATIO STRUCTURES

(71) Applicant: LAM RESEARCH AG, Villach (AT)

(72) Inventors: Ji Zhu, Castro Valley, CA (US); Gerome Michel Dominique Melaet, Berkeley, CA (US); Nathan Lavdovsky, San Jose, CA (US); Rafal Dylewicz, Landskron (AT); David Mui, Fremont, CA (US)

(73) Assignee: Lam Research AG, Villach (AT)

( * ) Notice: Subject to any disclaimer, the term of this patent is extended or adjusted under 35 U.S.C. 154(b) by 71 days.

This patent is subject to a terminal disclaimer.

(21) Appl. No.: 17/281,691

(22) PCT Filed: Sep. 26, 2019

(86) PCT No.: PCT/US2019/053249
§ 371 (c)(1),
(2) Date: Mar. 31, 2021

(87) PCT Pub. No.: WO2020/072278
PCT Pub. Date: Apr. 9, 2020

(65) Prior Publication Data
US 2021/0391166 A1    Dec. 16, 2021

Related U.S. Application Data
(60) Provisional application No. 62/740,562, filed on Oct. 3, 2018.

(51) Int. Cl.
*H01L 21/02* (2006.01)
*B08B 3/04* (2006.01)
(Continued)

(52) U.S. Cl.
CPC .......... *H01L 21/0206* (2013.01); *B08B 3/041* (2013.01); *B08B 3/08* (2013.01); *H01L 21/31116* (2013.01); *H01L 21/68764* (2013.01)

(58) Field of Classification Search
CPC .......... H01L 21/0206; H01L 21/31116; H01L 21/68764; H01L 21/02057;
(Continued)

(56) References Cited

U.S. PATENT DOCUMENTS 6,485,531 B1    11/2002  Schob
8,926,788 B2    1/2015   Hohenwarter
(Continued)

FOREIGN PATENT DOCUMENTS

CN    103081072 A    5/2013
JP    2007227764 A   9/2007
(Continued)

OTHER PUBLICATIONS

International Search Report and Written Opinion of the ISA issued in PCT/US2019/053249, dated Jan. 13, 2020; ISA/KR.
(Continued)

*Primary Examiner* — Erin F Bergner
(74) *Attorney, Agent, or Firm* — Weaver Austin Villeneuve & Sampson LLP

(57) ABSTRACT

A gas mixture for treating a substrate in a substrate processing system includes hydrogen fluoride gas, a vapor of an alcohol, an additive consisting of a base, and a carrier gas. The gas mixture can be used to treat high aspect ratio (HAR) structures arranged on a surface of a substrate. A surface of the substrate may be spin rinsed using a first rinsing liquid.

(Continued)

The first rinsing liquid is spun off from the surface of the substrate. The gas mixture is directed onto the surface of the substrate after the first rinsing liquid is dispensed.

24 Claims, 11 Drawing Sheets

(51) Int. Cl.
  *B08B 3/08* (2006.01)
  *H01L 21/311* (2006.01)
  *H01L 21/687* (2006.01)

(58) Field of Classification Search
  CPC ............. H01L 21/67017; H01L 21/67; H01L 21/67028; H01L 21/67051; H01L 21/687; H01L 21/02312; H01L 21/02282; H01L 21/02307; H01L 21/324; H01L 21/6715; H01L 21/67248; B08B 3/041; B08B 3/08
  See application file for complete search history.

(56) References Cited

U.S. PATENT DOCUMENTS

| | | | |
|---|---|---|---|
| 9,484,229 | B2 | 11/2016 | Lach et al. |
| 2002/0096190 | A1 | 7/2002 | Roy et al. |
| 2004/0020513 | A1 | 2/2004 | Bergman |
| 2006/0196527 | A1 | 9/2006 | Nishimura et al. |
| 2011/0155181 | A1 | 6/2011 | Inatomi |
| 2011/0183522 | A1 | 7/2011 | Mikhaylichenko et al. |
| 2012/0131815 | A1 | 5/2012 | Kraus et al. |
| 2012/0181249 | A1 | 7/2012 | Ohto et al. |
| 2013/0014785 | A1 | 1/2013 | Kimura et al. |
| 2013/0280123 | A1 | 10/2013 | Chen et al. |
| 2014/0026926 | A1 | 1/2014 | Semmelrock et al. |
| 2015/0357187 | A1 | 12/2015 | Morimoto et al. |
| 2016/0254162 | A1 | 9/2016 | Okutani et al. |
| 2016/0351390 | A1 | 12/2016 | Morimoto et al. |
| 2017/0186620 | A1 | 6/2017 | Marumoto et al. |
| 2018/0047593 | A1 | 2/2018 | Mui et al. |
| 2018/0076018 | A1 | 3/2018 | Otsuji |
| 2019/0264035 | A1* | 8/2019 | Aoki .................... C09D 201/08 |
| 2021/0280410 | A1 | 9/2021 | Otsuji |

FOREIGN PATENT DOCUMENTS

| | | |
|---|---|---|
| JP | 2015231043 A | 12/2015 |
| JP | 2018046260 A | 3/2018 |
| KR | 1020110077705 A | 7/2011 |
| KR | 1020110123078 A | 11/2011 |
| KR | 1020130035039 A | 4/2013 |
| KR | 20140132601 A | 11/2014 |
| TW | 201814395 A | 4/2018 |
| WO | WO-2012165861 A2 | 12/2012 |
| WO | WO-2019083735 A1 | 5/2019 |
| WO | WO-2020041441 A1 | 2/2020 |

OTHER PUBLICATIONS

International Search Report issued in PCT/US2018/055436, dated Jan. 30, 2019; ISA/KR.
International Search Report issued in PCT/US2019/047458, dated Dec. 10, 2019; ISA/KR.
Taiwanese Office Action for corresponding Taiwanese Application No. 108135456 dated Aug. 13, 2023.

* cited by examiner

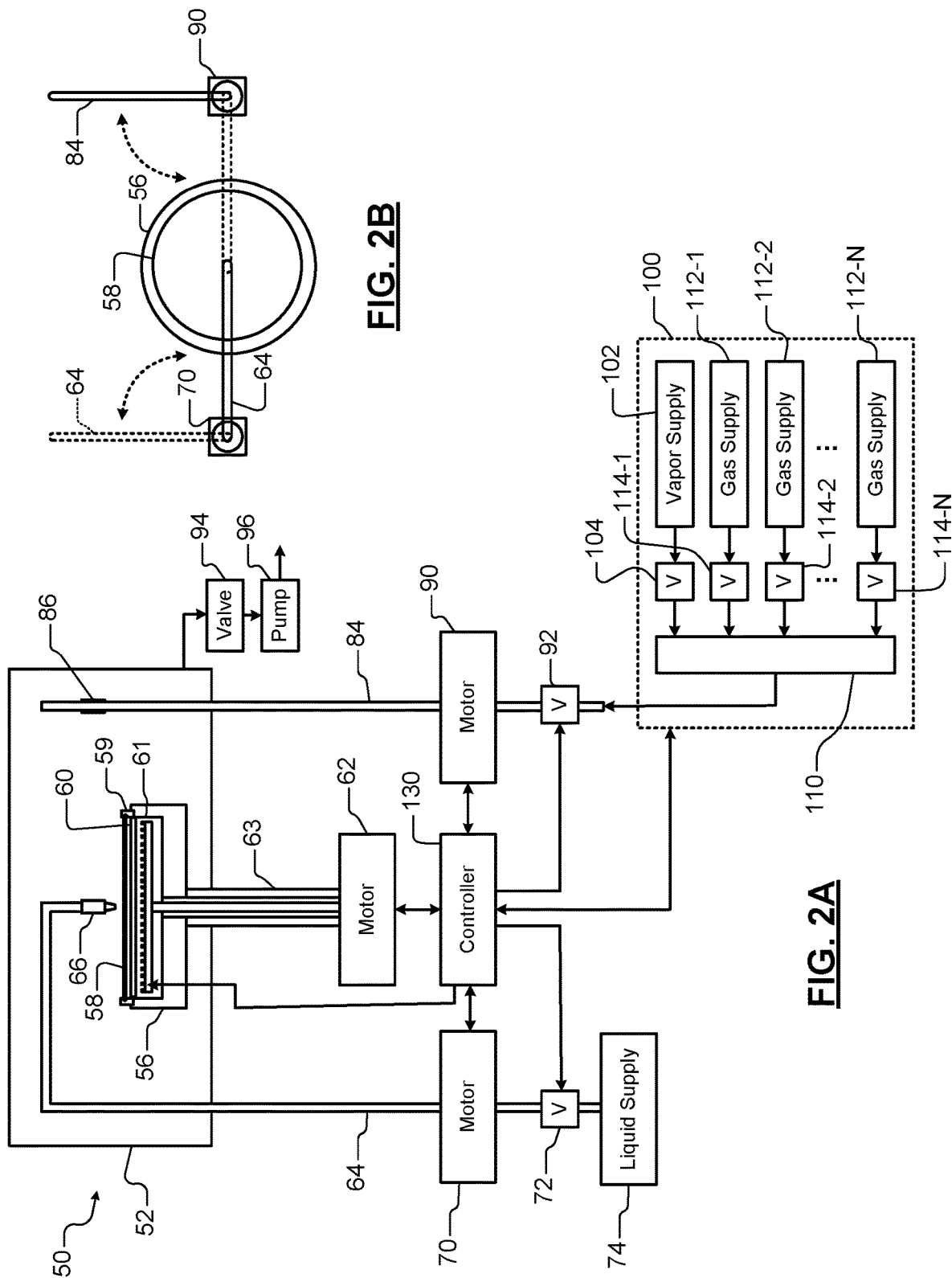

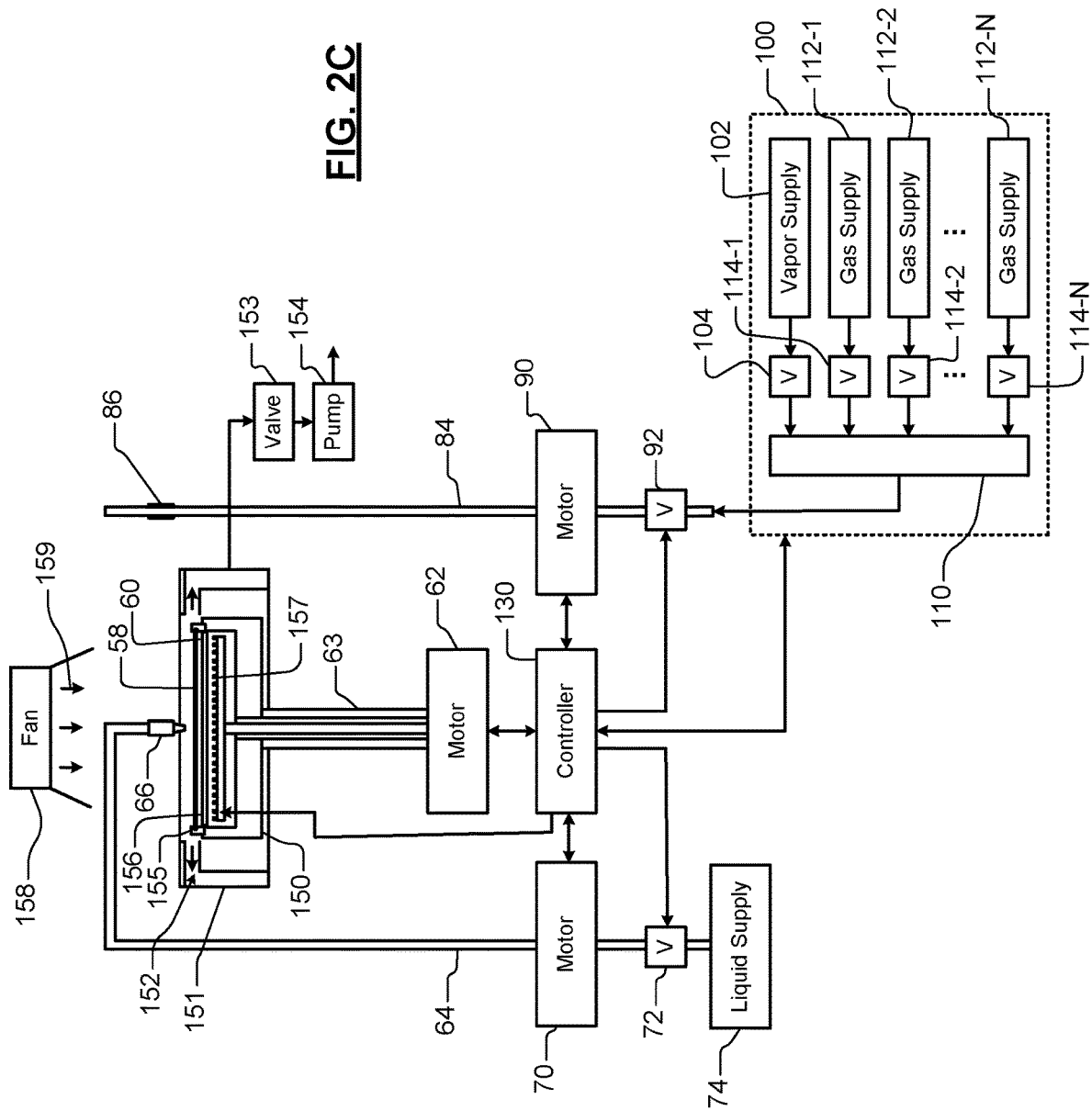

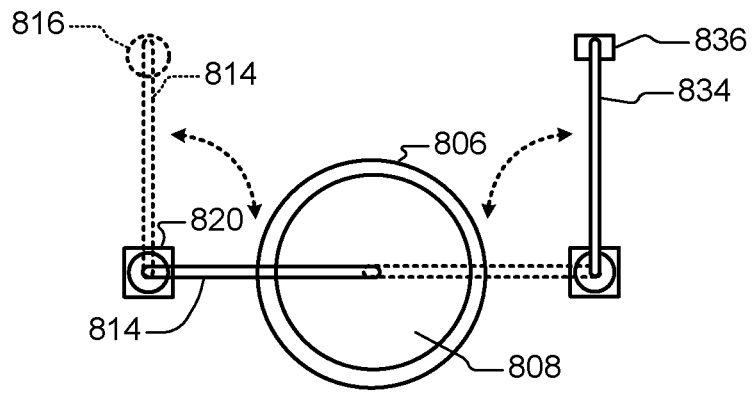
FIG. 8B
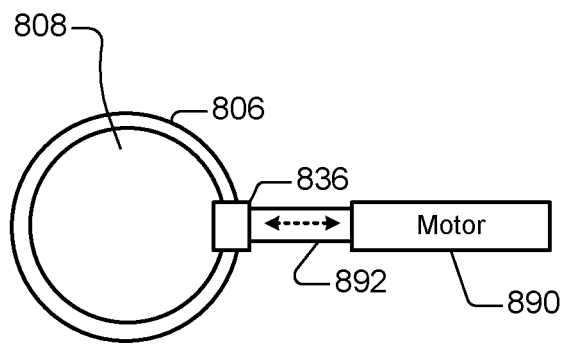
FIG. 8C
FIG. 8D     FIG. 8E

US 11,823,892 B2

GAS MIXTURE INCLUDING HYDROGEN FLUORIDE, ALCOHOL AND AN ADDITIVE FOR PREVENTING STICTION OF AND/OR REPAIRING HIGH ASPECT RATIO STRUCTURES

CROSS REFERENCE TO RELATED APPLICATIONS

The present disclosure is a U.S. National Phase Application under 35 U.S.C. 371 of International Application No. PCT/US2019/053249, filed on Sep. 26, 2019, which claims the benefit of U.S. Provisional Application No. 62/740,562, filed on Oct. 3, 2018. The entire disclosures of the applications referenced above are incorporated herein by reference.

FIELD

The present disclosure relates to processing of substrates, and more particularly to a gas mixture preventing stiction of or repairing high aspect ratio (HAR) structures.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to deposit film on a substrate such as semiconductor wafer or to etch, clean and/or otherwise treat the surface of the substrate. In some processes, the substrates may be subjected to wet processing. In these processes, the substrate may be mounted on a rotary chuck. As the rotary chuck is rotated, fluid nozzles may be used to dispense fluid such as a liquid or gas and/or heat may be applied to treat the substrate.

Some of the substrates include high aspect ratio (HAR) structures. For example, the HAR structures may include nanopillars, trenches or vias. The HAR structures have a width (parallel to a surface of the substrate) that is significantly less than a depth (perpendicular to a surface of the substrate) of the feature. More advanced processes include HAR structures having even higher aspect ratios. Pattern collapse occurs when one or more of the HAR structures collapse, move laterally relative to a surface of the substrate and/or directly contact adjacent HAR structures. Pattern collapse is often encountered during drying after a wet clean process.

Several processes have been used to reduce pattern collapse when drying substrates. For example, the substrate can be dried using supercritical $CO_2$. However, supercritical $CO_2$ is relatively expensive and has implementation issues. The surface of the substrate can be modified with a layer to prevent stiction. However, surface modification is often expensive since it requires extra chemistries to be used and applicable only to a specified film type, e.g., silicon oxide. Surface modification also leads to material loss since the modified layer needs to be removed. The substrate can also be dried using isopropyl alcohol (IPA) that is delivered to the surface of the substrate at a temperature close to the boiling point of IPA. However, some aspect ratios cannot be dried using boiling IPA without pattern collapse.

The substrate can also be treated using hydrogen fluoride (HF) vapor etching in vacuum equipment operated at vacuum pressures. However, the vacuum equipment is typically expensive and cannot be used to perform wet cleaning. The preceding wet clean step is often necessary to remove organic or metal contaminants from the surface of the substrate.

Repairing collapsed structures can be performed using plasma etching in vacuum equipment. However, the plasma etching hardware that is required is expensive.

SUMMARY

A gas mixture for treating a substrate in a substrate processing system includes hydrogen fluoride gas, a vapor of alcohol, an additive consisting of a base, and a carrier gas.

In other features, the base is selected from a group consisting of ammonia and an organic base. The base is selected from a group consisting of amines and a heteroaromatic cyclic compound. The heteroaromatic cyclic compound contains at least one nitrogen atom. The heteroaromatic cyclic compound consists of pyridine.

In other features, the additive is in a range from 0.1 parts per million (ppm) to 2000 ppm (mass) of the gas mixture. In other features, the additive is in a range from 1 part per million (ppm) to 500 ppm (mass) of the gas mixture.

In other features, the additive and the alcohol are mixed to create a mixture. The additive comprises 0.01 wt % to 1 wt % of the mixture of the additive and the alcohol. The mixture of the alcohol and the additive is added to the carrier gas and then the hydrogen fluoride gas is added. In other features, the hydrogen fluoride gas, the alcohol and the carrier gas are mixed and then the additive is added.

In other features, the gas mixture includes the hydrogen fluoride gas in a range from 0.5% to 5% volume of the gas mixture, the mixture of the alcohol and the additive in a range from 0.5% to 2.5% volume of the gas mixture, and the carrier gas in a range from 92.5% to 99% volume of the gas mixture.

In other features, the gas mixture includes the hydrogen fluoride gas in a range from 0.05% to 10% volume of the gas mixture, the mixture of the alcohol and the additive in a range from 0.5% to 2.5% volume of the gas mixture, and the carrier gas in a range from 87.5% to 99.45% volume of the gas mixture.

In other features, the alcohol vapor is selected from a group consisting of methanol, isopropyl alcohol and an alcohol including 1 to 4 carbon atoms. The carrier gas consists of molecular nitrogen.

A method for treating high aspect ratio (HAR) structures arranged on a surface of a substrate includes a) spin rinsing the surface of the substrate using a first rinsing liquid; b) spinning off the first rinsing liquid from the surface of the substrate; and c) directing the gas mixture onto the surface of the substrate after the first rinsing liquid is dispensed.

In other features, the substrate includes silicon nitride film and silicon dioxide film that are exposed to etching during c), and the silicon dioxide film is etched relative to the silicon nitride film with a selectivity greater than or equal to four (4) during c).

In other features, c) is performed after b). Alternately, c) is performed within 60 seconds after a). The gas mixture is delivered by a nozzle located in a range from 1 mm to 40 mm from the surface of the substrate. The gas mixture is delivered from a nozzle at a dispense velocity in a range from 1 to 50 m/s.

In other features, the gas mixture is delivered from a nozzle at a flow rate of 1 to 20 slm. A cross-sectional area of an orifice of a nozzle delivering the gas mixture is in a range from 3 to 30 mm². a), b) and c) are performed at a temperature in a range from 20° C. to 400° C. a), b) and c) are performed at a temperature in a range from 50° C. to 150° C. a), b) and c) are performed when the substrate is maintained at a predetermined pressure in a range from 900 hPa to 1100 hPa.

In other features, a), b) and c) are performed with the substrate arranged on a rotary chuck of a device. The gas mixture is delivered from one or more nozzles located in a vapor containment cavity recessed in a substrate-facing surface of a vapor containment head.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2A is a functional block diagram of an example of a rotary chuck arranged in a closed chamber for processing a substrate according to the present disclosure;

FIG. 2B is a plan view of the rotary chuck of FIG. 2A;

FIG. 2C is a functional block diagram of an example of a rotary chuck arranged in an open chamber for processing a substrate according to the present disclosure;

FIG. 8B is a plan view of the rotary chuck of FIG. 8A;

FIG. 8C is a plan view of an alternate example of the rotary chuck with an arm that sweeps the substrate in a radial direction according to the present disclosure;

FIGS. 8D and 8E are side views of examples of combined heads including a vapor containment head and a nozzle head according to the present disclosure;

In the drawings, reference numbers may be reused to identify similar and/or identical elements.

DETAILED DESCRIPTION

Figure 1C:
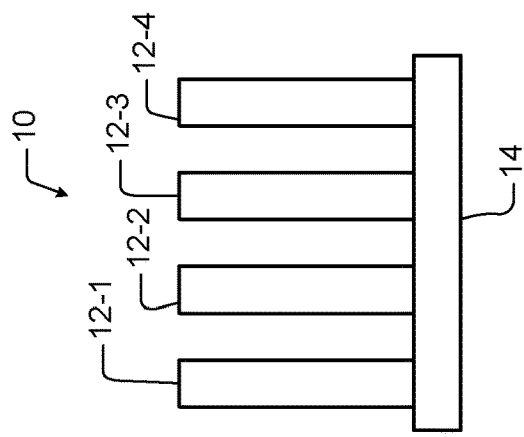
FIGS. 1A-1C are side cross-sectional views illustrating a substrate before and after wet cleaning and drying and after repair according to the present disclosure.

Systems and methods according to the present disclosure relate to a gas mixture including hydrogen fluoride, alcohol and an additive that can be used for processing substrates. In some examples, the gas mixture is used for wet processing and dry etching of a substrate including high aspect ratio (HAR) structures. The wet processing and dry etching can be performed at or near atmospheric pressure in a wet clean tool after the substrate is processed. The combination of wet processing and dry etching in a single hardware device provides a less expensive alternative to the other drying processes and adds little or no processing time. Alternately, the wet processing can be completed in the wet processing tool and the repair process can be performed in a separate repair tool. In some examples, after exposure to a rinsing liquid such as isopropyl alcohol (IPA), a gas mixture is dispensed onto the surface of the substrate.

Patterned structures such as HAR structures on substrates are sensitive to pattern collapse and require advanced drying systems and methods to avoid pattern damage post wet process. Examples of these systems and methods are described in commonly assigned U.S. Provisional Patent Application Ser. No. 62/575,705, filed on Oct. 23, 2017 and entitled "Systems and Methods for Preventing Stiction of High Aspect Ratio Structures and/or Repairing High Aspect Ratio Structures"; and commonly assigned U.S. Provisional Patent Application Ser. No. 62/721,710, filed on Aug. 23, 2018 and entitled "Vapor Containment Head for Preventing Stiction of High Aspect Ratio Structures and/or Repairing High Aspect Ratio Structures".

In some examples, these systems are used to remove oxide grown at contact locations to prevent subsequent pattern collapse. Some substrates also include exposed hard masks such as a silicon nitride ($Si_3N_4$) hard mask. To achieve collapse-free performance, some amount of oxide etching is required. However, it is difficult to etch the oxide without also causing damage to the hard masks.

The additive in the gas mixture according to the present disclosure acts as a proton acceptor and promotes the formation of bifluorine ($HF_2$), which is the active species in oxide etch. Etching of the silicon nitride hard mask is mainly determined by adsorbed HF concentration. The gas mixture described herein provides increased etch selectivity of oxide relative to silicon nitride as compared to the gas mixture without the additive. Using the gas mixture with the additive as described herein can increase the selectivity from less than 1 to greater than or equal to 4.

In some examples, the additive consists of a base. In some examples, the additive is in a range from 0.1 parts per million (ppm) to 2000 ppm (mass) of the gas mixture. In some examples, the base is selected from a group consisting of ammonia ($NH_3$) and an organic base. The base can be selected from a group consisting of amines and a heteroaromatic cyclic compound. In some examples, the heteroaromatic cyclic compound contains at least one nitrogen atom. In other examples, the heteroaromatic cyclic compound consists of pyridine ($C_2H_5N$).

In some examples, the gas mixture is prepared by creating a mixture of the additive and the alcohol. The mixture of the alcohol and the additive is added to the carrier gas and then the hydrogen fluoride gas is added. In other examples, the hydrogen fluoride gas, the carrier gas and the alcohol are mixed together to form a gas flow and then the additive is added to the gas flow. In some examples, the additive is in a range from 1 part per million (ppm) to 500 ppm (mass) of the gas mixture.

In some examples, the gas mixture includes the hydrogen fluoride gas in a range from 0.5% to 5% volume of the gas mixture, the mixture of the alcohol and the additive in a range from 0.5% to 2.5% volume of the gas mixture, and the carrier gas in a range from 92.5% to 99% volume of the gas mixture.

In other features, the gas mixture includes the hydrogen fluoride gas in a range from 0.05% to 10% volume of the gas mixture, the mixture of the alcohol and the additive in a range from 0.5% to 2.5% volume of the gas mixture, and the carrier gas in a range from 87.5% to 99.45% volume of the gas mixture.

In some examples, the alcohol vapor is selected from a group consisting of methanol, isopropyl alcohol (IPA) and an alcohol including 1 to 4 carbon atoms. In some examples, the carrier gas consists of molecular nitrogen. In some examples, the carrier gas consists of an inert gas.

The gas mixture described herein may be used for treating high aspect ratio (HAR) structures arranged on a surface of a substrate. As used herein, HAR structures include structures having an aspect ratio greater than 4:1. For example, a method for using the gas mixture may include spin rinsing the surface of the substrate using a first rinsing liquid, spinning off the first rinsing liquid from the surface of the substrate, and directing the gas mixture onto the surface of the substrate after the first rinsing liquid is dispensed. Additional details and examples are set forth below.

Figure 1B:
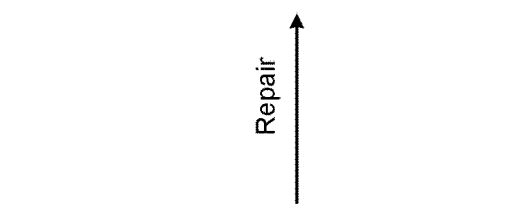
Figure 1A:
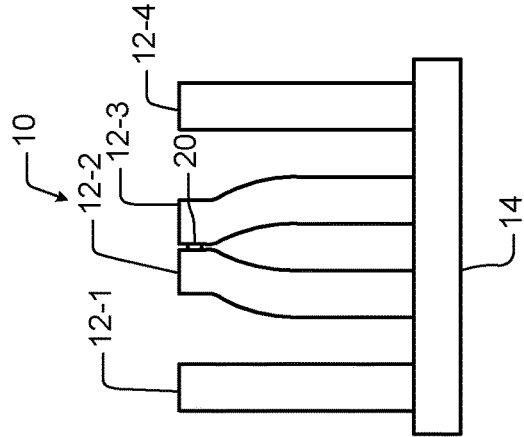

Referring now to FIGS. 1A-1C, processing of a substrate is shown. In FIG. 1A, a substrate 10 is shown prior to wet processing and drying. Substrate 10 includes high aspect ratio (HAR) structures 12-1, 12-2, 12-3 and 12-4 (collectively HAR structures 12) defined on one or more underlying layers 14. For example, the HAR structures 12 include pillars, vias, trenches, and/or other features. The substrate 10 in FIG. 1A is subjected to wet processing and drying.

In FIG. 1B, the substrate 10 is shown after the wet processing and drying. The HAR structures 12-2 and 12-3 partially collapse and lean towards one another. In some examples, a bridging oxide 20 is formed between the HAR structures 12-2 and 12-3. Examples of bridging oxides that may be formed include silicon oxide ($SiO_x$), silicon oxynitride ($SiO_xN_y$), titanium oxide ($TiO_x$), etc. In FIG. 1C, the substrate 10 is shown after treatment using the methods described herein such that the bridging oxide 20 is removed and the collapsed HAR structures 12-2 and 12-3 are repaired.

Referring now to FIG. 2A, an example of a rotary chuck 50 for wet processing and repairing a substrate is shown. The rotary chuck 50 includes a chamber 52 housing a rotary chuck 56. A substrate 58 is arranged on a surface of the rotary chuck 50. The rotary chuck 50 rotates the substrate 58 while liquid is dispensed onto the substrate 58 and/or to spin off the liquid. The substrate 58 may be attached to the rotary chuck 50 using any suitable mechanism. For example, the substrate 58 can be attached to the rotary chuck 50 using gripping pins 59. Suitable examples of gripping pins are shown and described in commonly assigned "Method and Apparatus for Processing Wafer-Shaped Articles", U.S. patent application Ser. No. 15/232,594, filed on Aug. 9, 2016.

In some examples, the surface 60 of the rotary chuck 56 is transparent and a heater 61 is arranged under the surface 60. In some examples, the heater 61 includes a plurality of light emitting diodes (LEDs) that are arranged in one or more radial zones to allow radial heating of the substrate 60. In some examples, the heater 61 can be operated to provide a moving heat wave that moves from a central location of the substrate outwardly to a radially outer edge thereof. In some examples, the rotary chuck 56 rotates and the heater 61 is stationary. Suitable examples of a rotary chuck performing radial heating of the substrate are shown and described in U.S. patent application Ser. No. 15/232,594.

In some examples, the rotary chuck 56 is rotated by a motor 62 via a drive shaft 63 as shown. In other examples, the motor 62 includes a rotor and stator and the rotor is driven magnetically without physical contact. Suitable examples are shown in commonly assigned U.S. Pat. No. 6,485,531. Rinsing liquid is delivered by an arm 64 and a nozzle 66 that are scanned across the substrate 58 by a motor 70. A valve 72 selectively supplies the rinsing liquid from a liquid supply 74 to the arm 64.

Another arm 84 (shown in an inactive position in FIG. 2A) and a gas nozzle 86 may be used to deliver the gas mixture described herein. In some examples, an outlet of the gas nozzle 86 is arranged within a predetermined distance of a surface of the substrate 58. In some examples, the predetermined distance is in a range from 1 mm to 40 mm. In some examples, the predetermined distance is in a range from 2 mm to 2 cm. In some examples, the gas mixture is delivered at a predetermined velocity in a range from 1 to 50 m/s. In some examples, the gas mixture is delivered at a predetermined flow in a range from 1 to 20 standard liters per minute (slm). In some examples, a cross-sectional area of an orifice of the nozzle 86 is in a range from 3 to 30 mm$^2$.

A motor 90 may be used to scan the nozzle 86 across the substrate 58 and a valve 92 may be used to selectively supply the gas mixture. A gas delivery system 100 includes a vapor supply 102 and a valve 104. In some examples, the vapor supply 102 includes a heated liquid ampoule, bubbler or other vaporizer. In some examples, the additive and the alcohol are supplied as liquids in the ampoule and the carrier gas flows across and entrains the liquid. Then, the hydrogen fluoride gas is added. Alternately, the alcohol is entrained by the carrier gas, the hydrogen fluoride gas is added to the carrier gas prior to or after entraining the alcohol. Then, the additive is then added to the gas mixture. Still other variations are contemplated.

The gas delivery system 100 further includes one or more gas supplies 112-1, 112-2, . . . , and 112-N (collectively gas supplies 112) and valves 114-1, 114-2, . . . , and 114-N (collectively valves 114). An optional manifold 110 may be used to allow the gases and vapors to mix prior to delivery via the optional valve 92. In some examples, mass flow controllers (not shown) are provided to more precisely control the gases and/or solvent vapor. A controller 130 controls the valves, the motors and the gas delivery system 100.

In FIG. 2B, the arms 64 and 84 are shown in plan view. The arm 64 is shown in a dispensing position over the substrate 58 while the arm 84 is shown in an inactive position. The arm 64 dispenses the rinsing liquid onto the substrate and the rinsing liquid is spun off. After dispensing the rinsing liquid, the arm 64 is moved to the inactive position and the arm 84 dispenses the gas mixture as will be described further below.

Referring now to FIG. 2C, a rotary chuck with an open chamber can also be used. Additional details of an open chamber rotary chuck are shown in commonly assigned U.S. Pat. No. 9,484,229. A rotary chuck 150 is arranged in a chamber 151 that is open at a top portion thereof. A bottom portion of the chamber 151 can be opened or closed. The chamber 151 defines one or more exhaust channels 152. In some examples, the one or more exhaust channels 152 are located in a plane including the substrate 58, are directed in a radially outward direction and are connected to a vacuum source. In some examples, the vacuum source includes a valve 153 and a pump 154 that are in fluid communication with the one or more exhaust channels 152.

In some examples, the rotary chuck 150 includes a plurality of gripping pins 155 arranged thereon and a transparent plate 156 arranged below the substrate 58. A heater 157 such as a printed circuit board including light emitting diodes (LEDs) may be arranged below the transparent plate 156 to heat the substrate 58. In some examples, the heater 157 produces a moving heat wave that is used during cleaning and/or repair. The moving heat wave moves from a central location of the substrate outwardly to a radially outer edge thereof. In some examples, the heater 157 is stationary and the rotary chuck 150 rotates. Suitable examples of a rotary chuck performing radial heating of the substrate are shown and described in commonly assigned U.S. patent application Ser. No. 15/232,594. In some examples, a fan 158 supplies airflow 159 to the top surface of the chamber 151 during processing.

Figure 3:
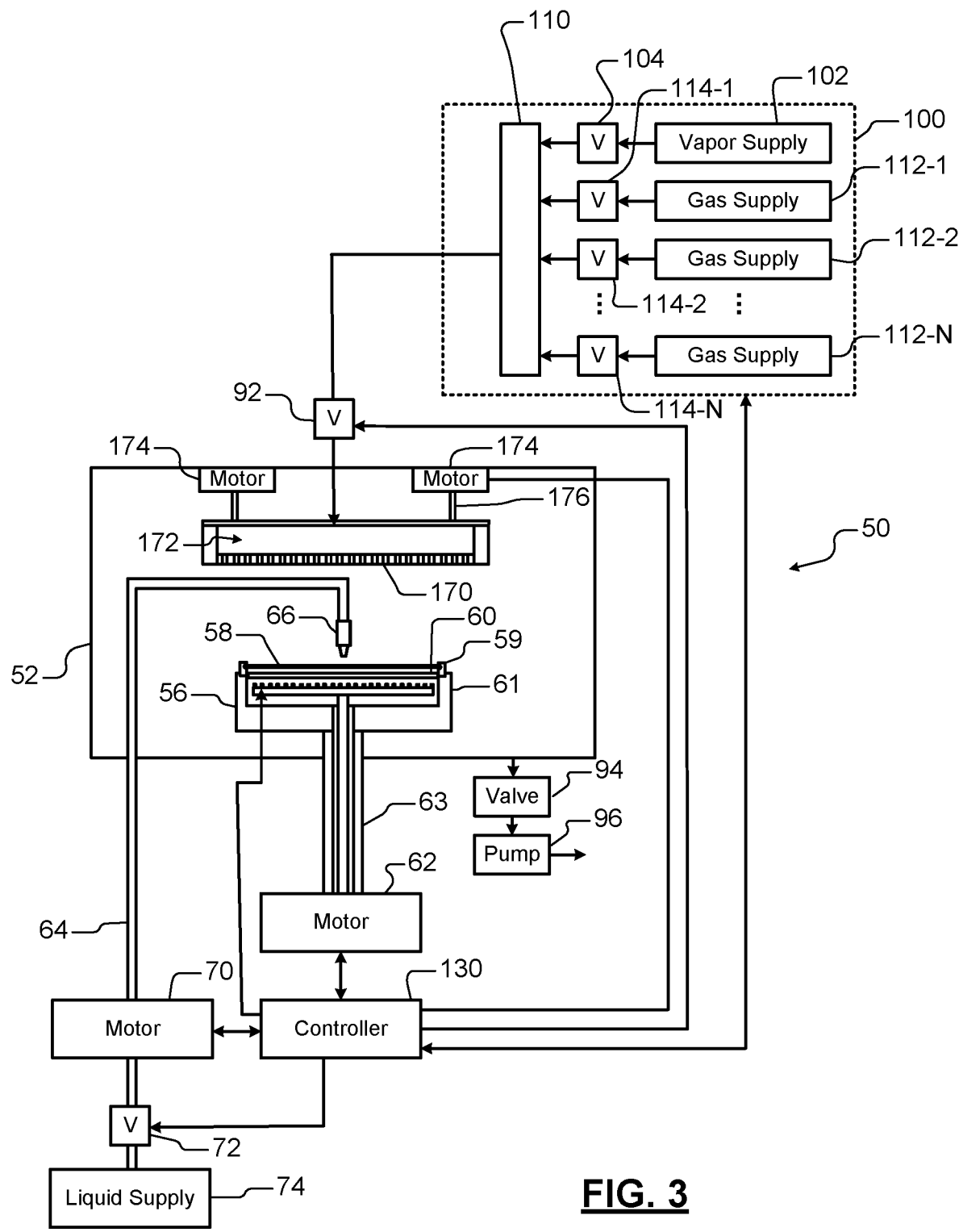
FIG. 3 is a functional block diagram of another example of a rotary chuck for processing a substrate according to the present disclosure.

Referring now to FIG. 3, another example of a rotary chuck for processing a substrate is shown. Instead of using the arm 84 and the nozzle 86, the gas mixture is dispensed using a showerhead 170 arranged above a surface of the substrate 58. Other suitable examples of a delivering gas through a showerhead onto a rotary chuck are shown and described in commonly assigned U.S. Pat. No. 8,926,788 and commonly assigned U.S. Patent Publication Nos. US2012/0131815 and US2014/0026926.

In some examples, the showerhead 170 includes a plate including a plurality of through holes. The gas mixture is delivered by the gas delivery system 100 and the valve 92 to a gas plenum 172. The gas mixture flows into the gas plenum 172, through the showerhead 170, and into the chamber 52 to expose the substrate 58. In some examples, a vertical position of the showerhead 170 and the gas plenum 172 is adjusted by one or more motors 174 and shafts 176 to a location closer to the substrate prior to delivery of the gas mixture when repairing or preventing collapse.

Figure 4:
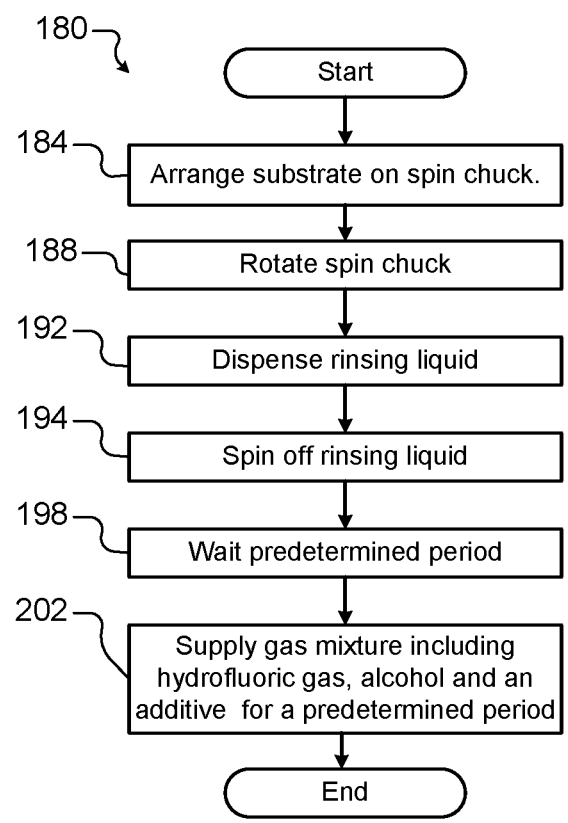
FIG. 4 is a flowchart illustrating an example of a method for processing a substrate according to the present disclosure.

Referring now to FIG. 4, a method 180 for processing a substrate is shown. At 184, the substrate is arranged on the rotary chuck. At 188, the rotary chuck is rotated. At 192, rinsing liquid is dispensed onto the substrate. At 194, the rinsing liquid is spun off.

After a predetermined period (at 198), the gas mixture including hydrogen fluoride, alcohol and the additive is supplied at 202. In other examples, the gas mixture can be applied in an overlapping manner during 194. The substrate can be either rotating or not rotating when applying the gas mixture.

In some examples, the predetermined period is in a range from 0 to 60 seconds. In some examples the gas mixture starts to be supplied before the rinsing step 192 has ended. The gas mixture is delivered for a predetermined period to prevent collapse and/or to repair HAR structures by removing bridging oxides.

Figure 6:
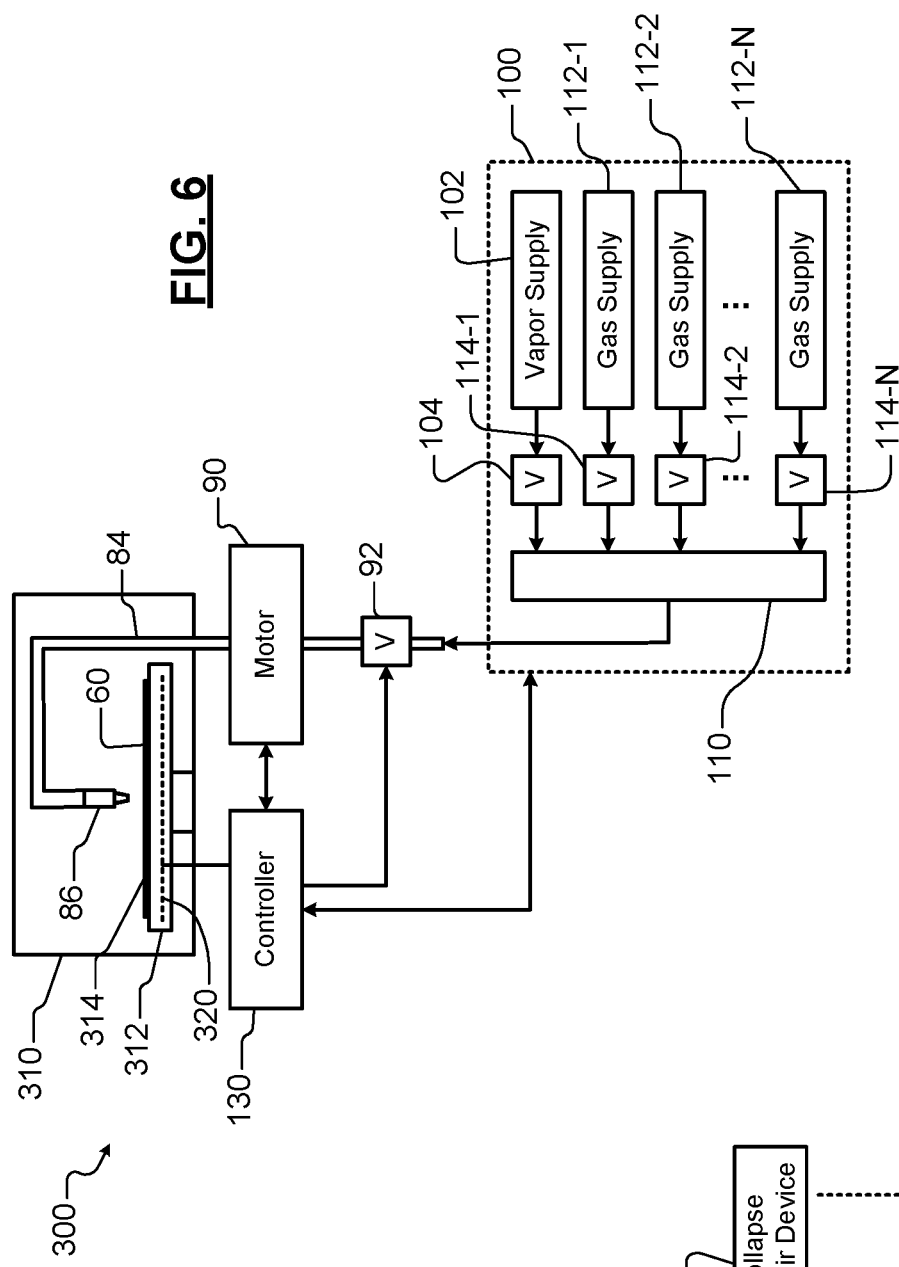
FIG. 6 is a functional block diagram of a collapse repair device utilizing an arm and a nozzle according to the present disclosure.
Figure 5:
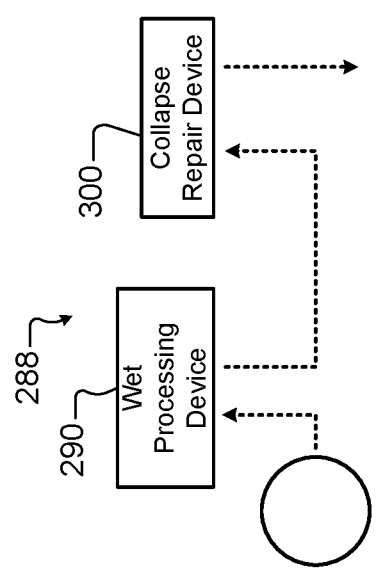
FIG. 5 is a functional block diagram illustrating a wet processing device and a separate collapse repair device according to the present disclosure.
Figure 7:
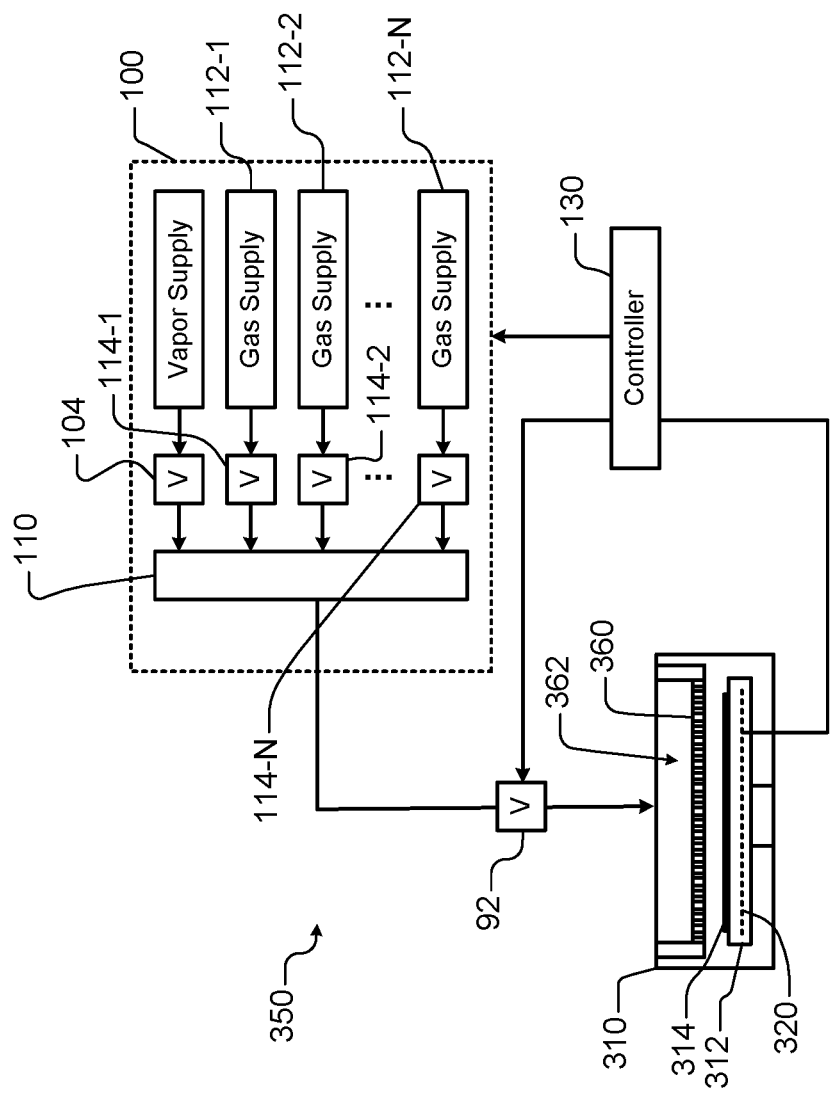
FIG. 7 is a functional block diagram of a collapse repair device utilizing a showerhead according to the present disclosure.

Referring now to FIGS. 5-7, wet processing and collapse repair can be performed in separate devices. In FIG. 5, a system 288 includes a wet processing device 290 that performs a wet processing step. After wet processing in the wet processing device 290, the substrate is moved to a collapse repair device 300. In some examples, the wet processing step includes wet cleaning. In some examples, the wet processing step is performed by a rotary chuck.

In FIG. 6, the collapse repair device 300 is shown. The collapse repair device 300 includes a chamber 310 and a substrate support 312 for supporting a substrate 314. The substrate support 312 includes a heater 320 such as a resistive heater and/or cooling channels to control a temperature of the substrate 314 during processing. The controller 130 controls the motor 90, the valve 92 and the gas delivery system 100 to perform collapse repair. Since the collapse repair device 300 does not perform wet cleaning, the nozzles and rotary chuck associated with wet processing device are omitted and the collapse repair device 300 can be simplified.

In FIG. 7, another example of a collapse repair device 350 is shown. The nozzle 86, the arm 84 and the motor 90 of the collapse repair device in FIG. 6 are replaced by a showerhead 360 arranged above a surface of the substrate 314. In some examples, the showerhead 360 includes a plate including a plurality of through holes. The gas mixture is delivered by the gas delivery system 100 and/or a valve 92 to a gas plenum 362. The gas mixture flows into the gas plenum 362 and through the showerhead 360 to expose the substrate 314.

Figure 8A:
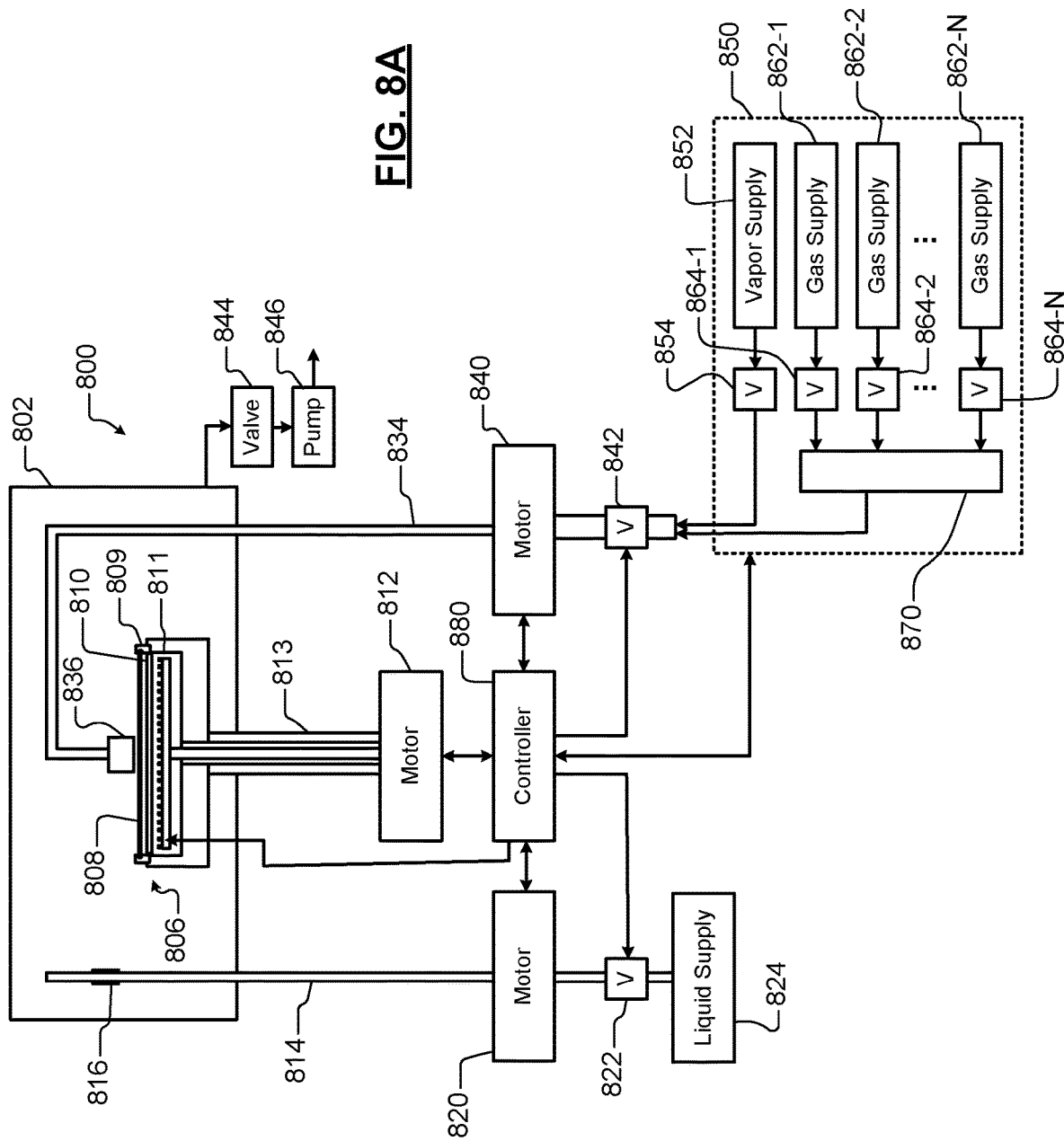
FIG. 8A is a functional block diagram of an example of a rotary chuck with a vapor containment head for processing a substrate according to the present disclosure.

Referring now to FIG. 8A, an example of a system 800 for wet processing and repairing a substrate is shown. The system 800 includes a chamber 802 housing a rotary chuck 806. A substrate 808 is arranged on a surface of the rotary chuck 806. The rotary chuck 806 rotates the substrate 808 while liquid is dispensed onto the substrate 808 and/or to spin off the liquid. The substrate 808 may be attached to the rotary chuck 806 using any suitable mechanism. For example, the substrate 808 can be attached to the rotary chuck 806 using gripping pins 809. Suitable examples of gripping pins are shown and described in commonly assigned "Method and Apparatus for Processing Wafer-Shaped Articles", U.S. patent application Ser. No. 15/232, 594.

In some examples, the surface 810 of the rotary chuck 806 is transparent and a heater 811 is arranged under the surface 810. In some examples, the heater 811 includes a plurality of light emitting diodes (LEDs) that are arranged in one or more radial zones to allow radial heating of the substrate 808. In some examples, the heater 811 can be operated to provide a moving heat wave that moves from a central location of the substrate outwardly to a radially outer edge thereof. In some examples, the rotary chuck 806 rotates and the heater 811 is stationary. Suitable examples of a rotary chuck performing radial heating of the substrate are shown and described in U.S. patent application Ser. No. 15/232, 594.

In some examples, the rotary chuck 806 is rotated by a motor 812 via a drive shaft 813 as shown. In other examples, the motor 812 includes a rotor and stator and the rotor is driven magnetically without physical contact. Suitable examples are shown in commonly assigned U.S. Pat. No. 6,485,531. Rinsing liquid is delivered by an arm 814 (shown in an inactive position) and a nozzle 816 that are scanned across the substrate 808 by a motor 820. The motor 820 scans the arm across the rotating substrate in a radial direction or arcuate direction. A valve 822 selectively supplies the rinsing liquid from a liquid supply 824.

Another arm 834 (shown in an active position in FIG. 8A) and a vapor containment head 836 may be used to deliver the gas mixture. In some examples, a vapor containment cavity of the vapor containment head 836 is arranged within a predetermined distance of a surface of the substrate 808 during etching. In some examples, the predetermined distance is in a range from greater than or equal to 0.1 mm to less than or equal to 10 mm. In other examples, the predetermined distance is in a range that is greater than or equal to 0.1 mm and less than or equal to 3 mm. In other examples, the predetermined distance is in a range from 1 mm to 3 mm. In some examples, the predetermined distance is 2 mm+/− 0.5 mm. In some examples, the gas mixture is delivered at a predetermined velocity in a range from 1 to 50 m/s. In some examples, the gas mixture is delivered at a predetermined flow in a range from 1 to 20 standard liters per minute (slm).

A motor 840 may be used to scan the vapor containment head 836 across the substrate 808 and a valve 842 may be used to selectively supply the gas mixture. A gas delivery system 850 includes a vapor supply 852 and a valve 854. In some examples, the vapor supply 852 includes a heated liquid ampoule, bubbler or other vaporizer. The gas delivery system 850 further includes one or more gas supplies 862-1, 862-2, ..., and 862-N (collectively gas supplies 862) and valves 864-1, 864-2, ..., and 864-N (collectively valves 864). A manifold 870 may be used to allow the gases to mix prior to delivery via the valve 842. In some examples, mass flow controllers (not shown) and/or secondary valves are provided to more precisely control the gases and/or solvent vapor. A controller 880 controls the valves, the motors and the gas delivery system 850.

In FIG. 8B, the arms 814 and 834 are shown in plan view. The arm 814 is shown in a dispensing position over the substrate 808 while the arm 834 is shown in an inactive position. The arm 814 dispenses the rinsing liquid onto the substrate and the rinsing liquid is spun off. After dispensing the rinsing liquid, the arm 814 is moved to the inactive position and the arm 834 dispenses the gas mixture using the vapor containment head 836 as will be described further below.

In FIGS. 8A and 8B, the vapor containment head 836 is moved across the substrate in an arcuate path. In FIG. 8C, the vapor containment head 836 can be moved by a motor 890 and an arm 892 in a linear direction such as along a radial line or another line across of the substrate 808.

In FIG. 8D, a combined head 894 includes the vapor containment head 836 and a nozzle head 895. The nozzle head 895 includes one or more nozzles 896 to deliver gas and/or liquid onto the substrate. For example, the one or more nozzles 896 may be used to deliver gas such as molecular nitrogen ($N_2$), isopropyl alcohol (IPA) and/or deionized water (DIW). As can be appreciated, this arrangement requires a single arm rather than the two arms shown in FIGS. 8A and 8B.

In some examples, the vapor containment head 836 includes a heater 897 to control a temperature thereof. In some examples, the heater 897 includes a resistive heater. A temperature sensor 898 such as a thermocouple may be used to sense a temperature of the vapor containment head 836. The controller 880 monitors the temperature sensor 898 and adjusts operation of the heater to provide a desired temperature. In other examples, the heater 897 includes a temperature coefficient of resistance (TCR) heater, which has a resistance that is related to a temperature thereof. If the TCR heater is used, the controller 880 monitors voltage and/or current supplied to the TCR heater to determine the resistance and varies the voltage and current to provide a desired resistance corresponding to a desired temperature.

Referring now to FIG. 8E, the vapor containment head 836 includes a heater including one or more internal passages 899 in a body of the vapor containment head. The one or more internal passages 899 receive a heated fluid such as a heated gas or heated liquid from a fluid source (not shown). Non-limiting examples of suitable fluids include heated molecular nitrogen ($N_2$), heated coolant, heated water, etc. A pump, a valve, and a fluid source (all not shown) may be used to flow the fluid through the one or more internal passages 899.

Figure 10:
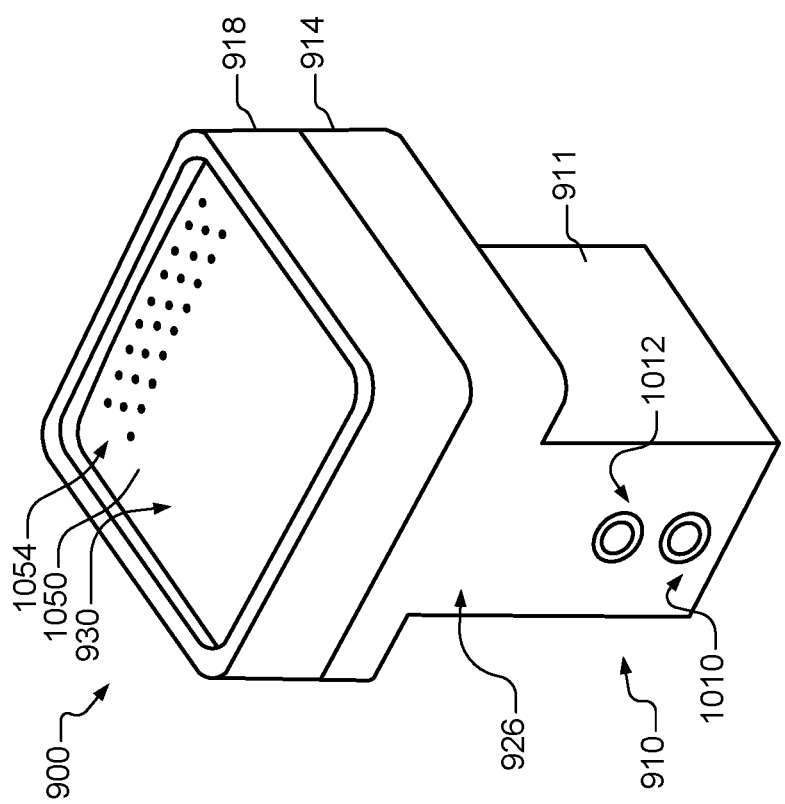
FIGS. 9 and 10 are top and bottom perspective views of an example of a vapor containment head according to the present disclosure.
Figure 9:
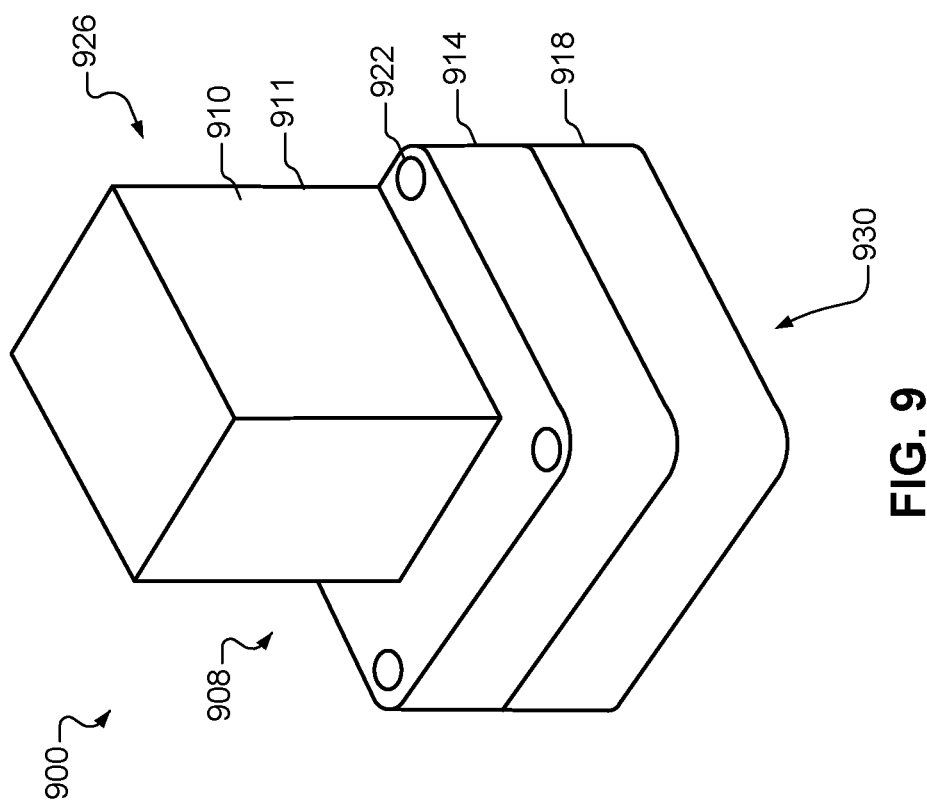

Referring now to FIGS. 9 and 10, a vapor containment head 900 is shown. In FIG. 9, the vapor containment head 900 includes a body 908. The body 908 includes a first portion 910 (including an upper portion 911 connected to a flanged lower portion 914) and a second portion 918. As can be appreciated, the vapor containment head 900 can be implemented with additional or fewer portions.

Fasteners 922 are arranged in bores defined in the flanged lower portion 914 and the second portion 918 to connect the first portion 910 to the second portion 918. The vapor containment head 900 includes a back side surface 926 and a bottom surface 930. The back side surface 926 may be connected to an arm, a nozzle head or other supporting structure. The bottom surface 930 is arranged adjacent to and is swept across a top surface of the substrate during processing.

In FIG. 10, the back side surface 926 includes one or more ports 1010 and 1012 that receive gas mixtures and/or liquid mixtures. In some examples, the ports 1010 and 1012 include tube gripping portions to engage gas tubes (not shown) connected thereto. The bottom surface 930 defines a vapor containment cavity 1050. The vapor containment cavity 1050 increases a residence time of the gas mixture adjacent to the substrate and reduces dilution by ambient gases.

In some examples, the vapor containment cavity 1050 is bounded by side surfaces and a downwardly facing surface of the second portion 918. In some examples, the vapor containment cavity has a generally rectangular cross section with rounded edges in a plane that is perpendicular to the substrate, although other shapes can be used. In some examples, the vapor containment cavity has a banana-shaped cross section in a plane perpendicular to the substrate, although other shapes can be used.

Through holes 1054 pass from an inner plenum (shown below) defined by the vapor containment head 900 through the bottom surface 930 to supply vapor and/or other gases into the vapor containment cavity 1050. While through holes 1054 are shown, one or more nozzles or slit-shaped nozzles can be used. Alternately, fluid passages may pass through the body of the vapor containment head and connect directly to through holes, nozzles or slit-shaped nozzles. In some examples, the through holes 1054 have a diameter in a range from 0.1 mm to 2 mm, although other diameters can be used. In some examples, the through holes 1054 have a diameter in a range from 0.4 mm to 0.6 mm, although other diameters can be used. In some examples, the vapor containment cavity defines an area covering 0.1% to 30% of the substrate area. Alternatively one or more slit-shaped nozzles can be used.

The number of through holes 1054 and their relative arrangement can be varied. Likewise, a cross-sectional shape of the vapor containment head 900 and a shape of the vapor containment cavity 1050 can be varied. In some examples, the through holes 1054 are arranged adjacent to a leading-edge of the vapor containment head 900 as it is swept across the rotating substrate during processing (with rows of through holes 1054 arranged perpendicular to a sweep direction). In some examples, the through holes 1054 of the vapor containment head are cleared from an edge of the substrate when the vapor containment head is not in use.

Figure 11A:
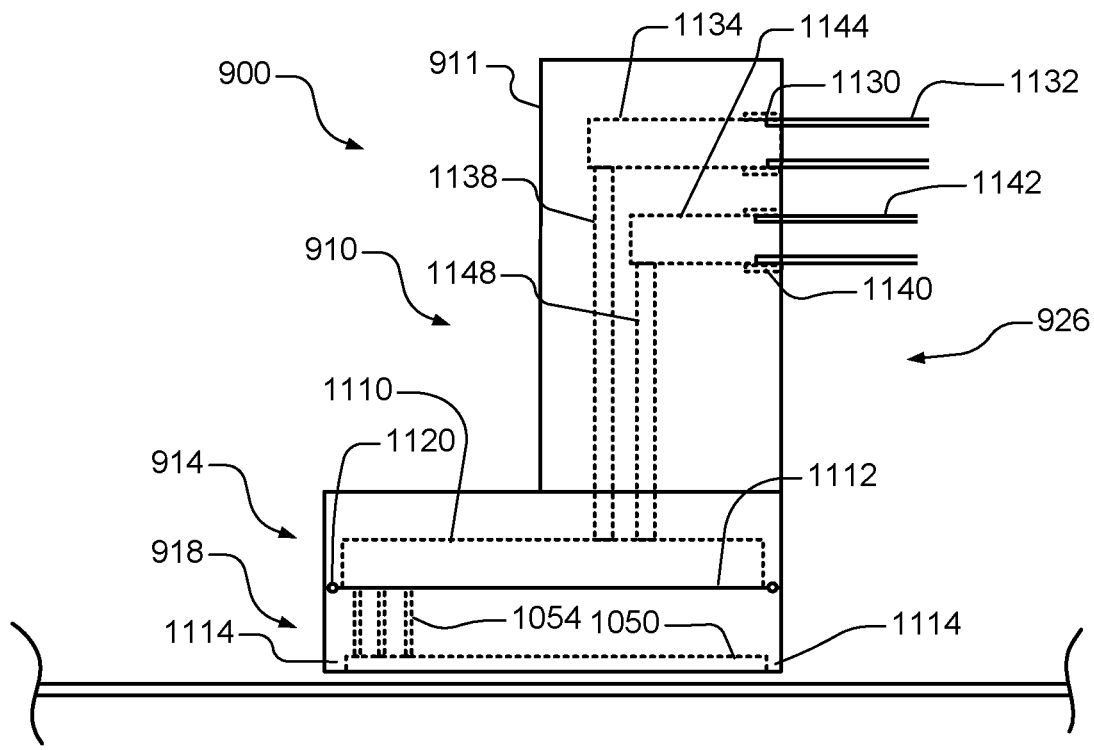
FIGS. 11A and 11B are side cross-sectional and bottom views of an example of a vapor containment head according to the present disclosure.
Figure 11B:
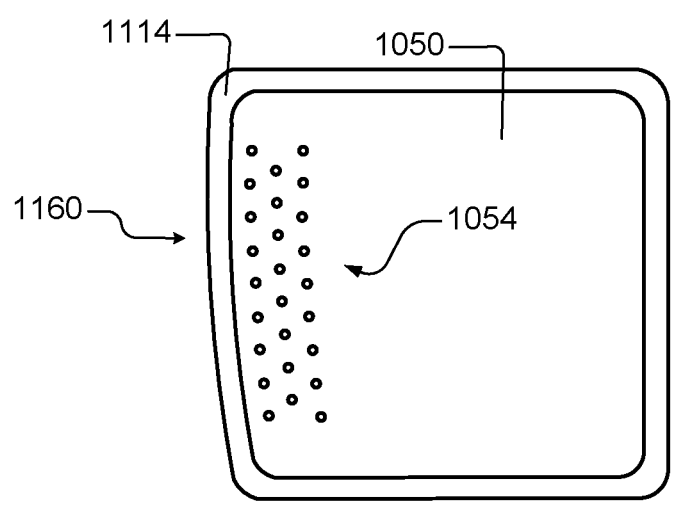

Referring now to FIGS. 11A and 11B, the vapor containment head 900 defines an internal plenum 1110 that is in fluid communication with one end of the through holes 1054. The opposite end of the through holes 1054 are in fluid communication with the vapor containment cavity 1050. In some examples, the internal plenum 1110 is defined by a bottom surface of the flanged lower portion 914 and a top surface 1112 of the second portion 918. In some examples, a downwardly projecting flange 1114 of the second portion 918 surrounds the vapor containment cavity 1050 and is maintained a predetermined distance from a top surface of the substrate during etching. In some examples, the predetermined distance is greater than or equal to 0.1 mm and less than or equal to 6 mm, or less than or equal to 5 mm, or less than or equal to 4 mm, or less than or equal to 3 mm, or less than or equal to 2 mm or less than or equal to 1 mm. In some examples, a depth of the vapor containment cavity in a vertical direction is less than or equal to 4 mm, less than or equal to 3 mm, less than or equal to 2 mm or less than or equal to 1 mm. In some examples, the predetermined distance is greater than 0.5 mm. In some examples the depth of the vapor containment cavity is in a range of 0.3 mm and 6 mm.

In some examples, a seal 1120 (such as a gasket of an O-ring arranged in a channel (not shown) formed on the first portion 910 and/or the second portion 918) may be used to provide a seal between the first portion 910 and the second portion 918. In other examples, the first portion 910 and the second portion 918 may be welded together to provide a seal.

A tube gripping element 1130 arranged at an opening of a gas flow passage 1134 grips an end of a tube 1132. In some examples, the gas flow passage 1134 is arranged in a horizontal direction. The gas flow passage 1134 fluidly connects to a gas flow passage 1138. In some examples, the gas flow passage 1138 is arranged in a vertical direction. The gas flow passage 1138 fluidly connects the gas flow passage 1134 to the internal plenum 1110.

A tube gripping element 1140 arranged at an opening of a gas flow passage 1144 grips an end of a tube 1142. In some examples, a gas flow passage 1144 is arranged in a horizontal direction and fluidly connects to a gas flow passage 1148. In some examples, the gas flow passage 1148 is arranged in a vertical direction. The gas flow passage 1148 fluidly connects the gas flow passage 1144 to the internal plenum 1110.

In some examples, the through holes 1054 are arranged adjacent to an edge such as a leading edge 1160 of the vapor containment head 900. In some examples, the through holes 1054 include staggered rows including 9, 8 and 9 through holes 1054, although additional or fewer rows and/or through holes can be used. In some examples, the through holes 1054 are arranged in an area that is less than or equal to 25% of the area defined by the vapor containment cavity 1050. In FIG. 5B, the second portion 918 defines a downwardly-projecting flange 1114 around an outer periphery of the bottom surface 930. The downwardly-projecting flange 1114 defines an outer periphery of the vapor containment cavity 1050. Additional variations of the vapor containment head can be found in U.S. Provisional Patent Application Ser. No. 62/721,710.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. A method for treating high aspect ratio (HAR) structures arranged on a surface of a substrate, comprising:
    providing a gas mixture for treating the substrate in a substrate processing system, the gas mixture comprising:
        hydrogen fluoride gas;
        a vapor of an alcohol;
        an additive consisting of a base; and
        a carrier gas;
    a) spin rinsing the surface of the substrate using a first rinsing liquid;
    b) spinning off the first rinsing liquid from the surface of the substrate; and
    c) directing the gas mixture onto the surface of the substrate after the first rinsing liquid is dispensed,
    wherein the gas mixture is delivered from one or more nozzles located in a vapor containment cavity recessed in a substrate-facing surface of a vapor containment head mounted on an arm.

2. The method of claim 1, wherein the base is selected from a group consisting of ammonia and an organic base.

3. The method of claim 1, wherein the base is selected from a group consisting of amines and a heteroaromatic cyclic compound.

4. The method of claim 3, wherein the heteroaromatic cyclic compound contains at least one nitrogen atom.

5. The method of claim 3, wherein the heteroaromatic cyclic compound consists of pyridine.

6. The method of claim 1, wherein the additive is in a range from 0.1 parts per million (ppm) to 2000 ppm (mass) of the gas mixture.

7. The method of claim 6, wherein the gas mixture includes:
    the hydrogen fluoride gas in a range from 0.5% to 5% volume of the gas mixture;
    the gas mixture of the alcohol and the additive in a range from 0.5% to 2.5% volume of the gas mixture; and
    the carrier gas in a range from 92.5% to 99% volume of the gas mixture.

8. The method of claim 6, wherein the gas mixture includes:

the hydrogen fluoride gas in a range from 0.05% to 10% volume of the gas mixture;

the gas mixture of the alcohol and the additive in a range from 0.5% to 2.5% volume of the gas mixture; and the carrier gas in a range from 87.5% to 99.45% volume of the gas mixture.

9. The method of claim 1, wherein the alcohol is selected from a group consisting of methanol, isopropyl alcohol and an alcohol including 1 to 4 carbon atoms.

10. The method of claim 1, wherein the carrier gas consists of molecular nitrogen.

11. The method of claim 1, wherein:

the substrate includes silicon nitride film and silicon dioxide film that are exposed to etching during c), and the silicon dioxide film is etched relative to the silicon nitride film with a selectivity greater than or equal to four (4) during c).

12. The method of claim 1, wherein c) is performed after b).

13. The method of claim 1, wherein c) is performed within 60 seconds after a).

14. The method of claim 1, wherein the gas mixture is delivered by the one or more nozzles located in a range from 1 mm to 40 mm from the surface of the substrate.

15. The method of claim 1, wherein the gas mixture is delivered from the one or more nozzles at a dispense velocity in a range from 1 to 50 m/s.

16. The method of claim 1, wherein the gas mixture is delivered from the one or more nozzles at a flow rate of 1 to 20 slm.

17. The method of claim 1, wherein a cross-sectional area of an orifice of the one or more nozzles delivering the gas mixture is in a range from 3 to 30 $mm^2$.

18. The method of claim 1, wherein a), b) and c) are performed at a temperature in a range from 20° C. to 400° C.

19. The method of claim 1, wherein a), b) and c) are performed at a temperature in a range from 50° C. to 150° C.

20. The method of claim 1, wherein a), b) and c) are performed when the substrate is maintained at a predetermined pressure in a range from 900 hPa to 1100 hPa.

21. The method of claim 1, wherein a), b) and c) are performed with the substrate arranged on a rotary chuck of a device.

22. The method of claim 1 further comprising preparing the gas mixture by mixing the hydrogen fluoride gas, the vapor of the alcohol, the additive consisting of the base, and the carrier gas in a predetermined order.

23. The method of claim 1 further comprising preparing the gas mixture by mixing the vapor of the alcohol and the additive consisting of the base, adding a mixture of the vapor of the alcohol, the additive consisting of the base to the carrier gas, and then adding the hydrogen fluoride gas.

24. The method of claim 1 further comprising preparing the gas mixture by mixing the hydrogen fluoride gas, the carrier gas, and the vapor of the alcohol to form a gas flow and then adding the additive consisting of the base to the gas flow.

* * * * *